United States Patent [19]

Iyer

[11] Patent Number: 5,913,128
[45] Date of Patent: Jun. 15, 1999

[54] METHOD FOR FORMING TEXTURIZED POLYSILICON

[75] Inventor: Ravi Iyer, Boise, Id.

[73] Assignee: Micron Technology, Inc., Boise, Id.

[21] Appl. No.: 08/959,648

[22] Filed: Oct. 28, 1997

Related U.S. Application Data

[62] Division of application No. 08/506,674, Jul. 24, 1995, abandoned.

[51] Int. Cl.[6] .................................................. H01L 21/20
[52] U.S. Cl. ......................... 438/398; 438/255; 438/964
[58] Field of Search ........................... 257/309; 438/255, 438/398, 964

[56] References Cited

U.S. PATENT DOCUMENTS

| | | | |
|---|---|---|---|
| Re. 35,420 | 1/1997 | Cathey et al. .......................... | 438/398 |
| 5,278,091 | 1/1994 | Fazan et al. ............................ | 437/52 |
| 5,340,765 | 8/1994 | Dennison et al. ...................... | 437/52 |
| 5,407,534 | 4/1995 | Thakur ................................... | 156/662 |
| 5,663,090 | 9/1997 | Dennison et al. ...................... | 438/398 |
| 5,691,228 | 11/1997 | Ping et al. ............................. | 438/398 |
| 5,721,171 | 2/1998 | Ping et al. ............................. | 438/398 |
| 5,759,262 | 6/1998 | Weimer et al. ........................ | 438/398 |
| 5,770,500 | 8/1998 | Batra et al. ............................ | 438/398 |

*Primary Examiner*—Peter Toby Brown
*Assistant Examiner*—Toniae M. Thomas

[57] ABSTRACT

A method to form a texturized polysilicon surfaced capacitor plate structure and a texturized polysilicon surfaced capacitor plate structure formed by the method are disclosed. The method steps are: depositing an amorphous silicon layer over a capacitor plate by plasma dissociation of $SiH_4$; exposing the amorphous silicon layer to a mixture of $CF_4$ and Ar; forming amorphous silicon seeding sites that are distributed on the surface of the first amorphous silicon layer by exposing the first amorphous layer to fluorine atoms; and vacuum annealing the amorphous silicon layer to form a texturized polysilicon on the capacitor plate, where the step of vacuum annealing is performed after the amorphous silicon material is exposed to the fluorine atoms.

29 Claims, 3 Drawing Sheets

METHOD FOR FORMING TEXTURIZED POLYSILICON

This application is a divisional to U.S. patent application Ser. No. 08/506,674, filed Jul. 24, 1995, now abandoned.

FIELD OF THE INVENTION

This invention relates to semiconductor fabrication processing and more particularly to a process for forming Hemi-Spherical Grain (HSG) polysilicon.

BACKGROUND OF THE INVENTION

The continuing trend of scaling down integrated circuits has forced the semiconductor industry to consider new techniques for fabricating precise components at submicron levels. Along with the need for smaller components, there has been a growing demand for devices requiring less power consumption. In the manufacture of transistors, these trends have led the industry to refine approaches to achieve thinner cell dielectric and gate oxide layers.

In dynamic semiconductor memory storage devices it is essential that storage node capacitor cell plates be large enough to retain an adequate charge (or capacitance) in spite of parasitic capacitance and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer.

Though stacked (capacitor) storage cells are promising candidates to achieve sufficient storage capacitance in a limited area, as the DRAM cell size shrinks, scaling of the stacked capacitor structures is becoming more difficult.

Storage capacitance can be enhanced by using Hemi-Spherical Grain (HSG) silicon to form the storage node electrode without increasing the area required for the cell or the storage electrode height. Some available methods include those methods disclosed in U.S. Pat. Nos. 5,407,534, 5,278,091 and 5,340,765, which are hereby incorporated by reference.

SUMMARY OF THE INVENTION

An embodiment of the present invention discloses a HSG polysilicon (or texturized polysilicon) surface formed by method steps of:

a) exposing an amorphous silicon material to fluorine atoms;
b) forming silicon seeding sites distributed on the surface of the amorphous silicon material; and
c) vacuum annealing the amorphous silicon material to form the texturized polysilicon surface, the step of vacuum annealing is performed after the amorphous silicon material is exposed to the fluorine atoms.

Another embodiment of the present invention discloses a method for forming a texturized polysilicon surface, the method comprising the steps of:

a) exposing an amorphous silicon material to fluorine atoms;
b) forming silicon seeding sites distributed on the surface of the amorphous silicon material; and
c) vacuum annealing the amorphous silicon material to form the texturized polysilicon surface, the step of vacuum annealing is performed after the amorphous silicon material is exposed to the fluorine atoms.

DETAILED DESCRIPTION OF THE PRESENT INVENTION

Figure 1:
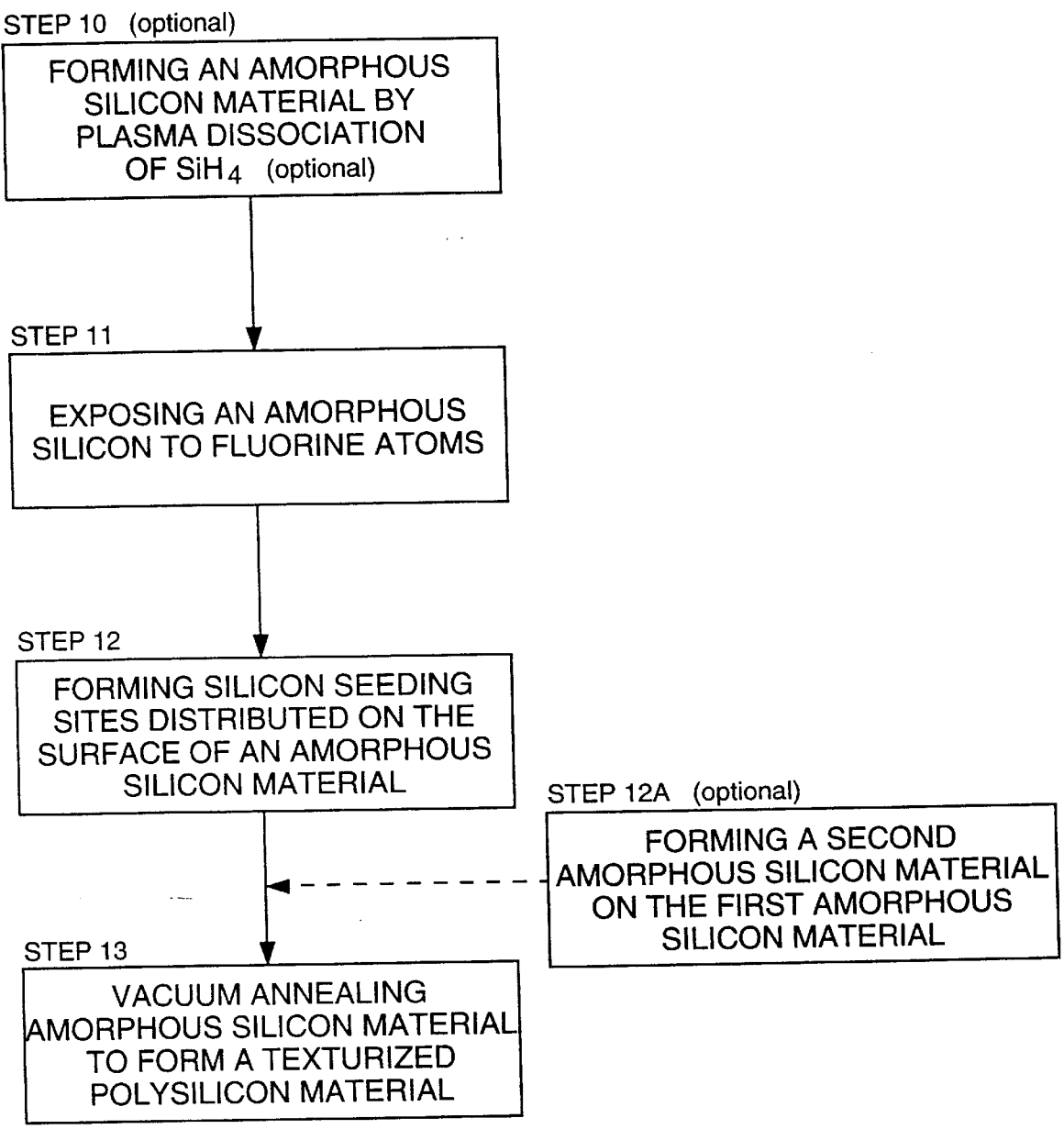
FIG. 1 is a process flow diagram of an embodiment of the present invention with optional steps included.
Figure 2:
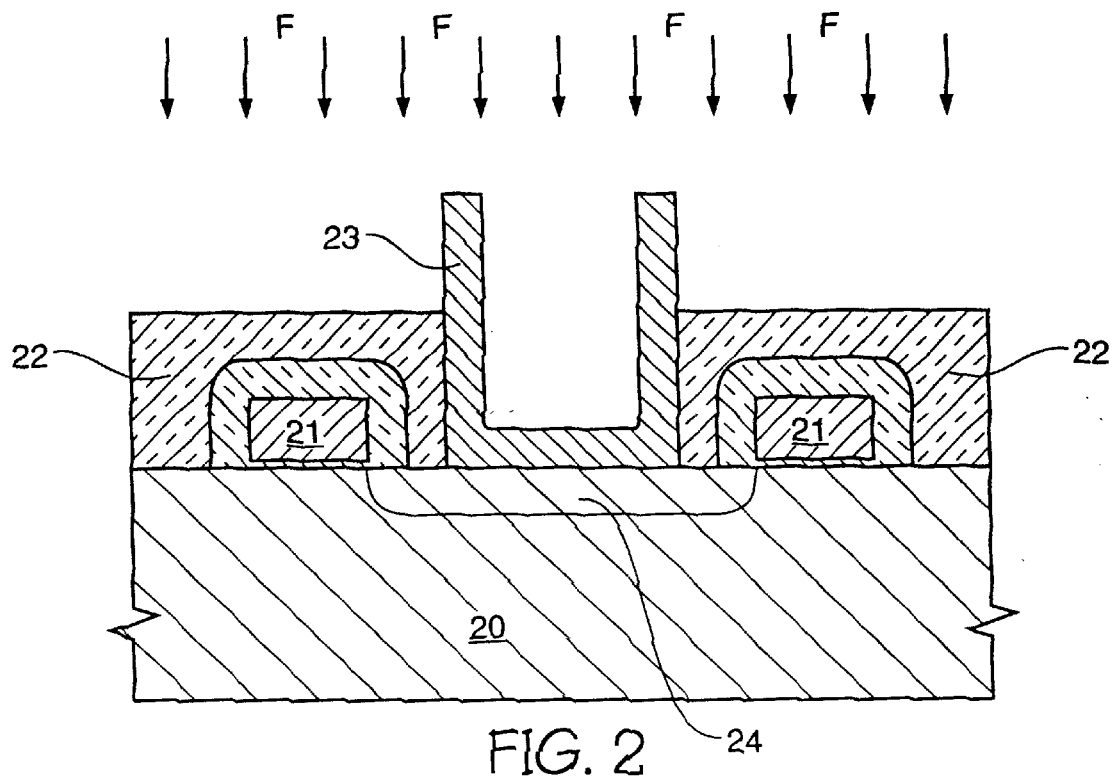
FIG. 2 is a composite cross-sectional view of an in-process wafer portion depicting the beginning stages of forming a DRAM container storage cell that is subjected to fluorine atoms.

An embodiment of the present invention is directed to a process for forming texturized polysilicon (or a texturized polysilicon surface) as depicted in the process steps of FIG. 1.

Referring now to FIG. 1, in optional step 10, amorphous silicon material is either already formed by methods know to those skilled in the art or it is preferred that the amorphous silicon material is an amorphous silicon layer formed over a starting material in a reaction chamber by plasma dissociation of silicon containing gases such as $SiH_4$ or $Si_2H_6$.

During step 11, the amorphous silicon material is exposed to fluorine atoms for a preferred time period ranging from 30 sec to 30 min. It is preferred that the amorphous silicon material be exposed to a fluorine containing gas while inside a chamber under vacuum. Preferred gases are as $CHF_3$, $NF_4$ or $CF_4$ that may also be mixed with Ar or N.

During step 12, the fluorine atoms become absorbed by the amorphous silicon material as it displaces any oxide residue on the surface and in turn forms silicon seeding sites distributed on the surface of the amorphous silicon material.

During step 13, the amorphous silicon material, having silicon seeding sites distributed thereon, is subjected to a vacuum anneal to form a texturized polysilicon surfaced material. The vacuum annealing is performed after the amorphous silicon material is exposed to the fluorine atoms and after a sufficient amount of fluorine atoms are absorbed into the amorphous silicon material. Exposing the amorphous silicon material to fluorine atoms for a preferred time ranging from 30 sec to 30 min (as mentioned above) provides enough time for the amorphous silicon material to absorb a sufficient amount of fluorine atoms.

During step 13 (vacuum annealing), it is preferred that the annealing be performed in a vacuum chamber at a pressure lower than 0.1 Torr. It is also preferred that the vacuum chamber is operated at a temperature ranging from approximately 450° C. to 650° C. and that the annealing is carried out for a time period ranging from approximately 30 sec to 30 min. (The ranges listed are intended to include all numerical values and ranges assumed therein.)

As shown in optional step 12A, a second amorphous silicon material (such as an amorphous silicon layer) is formed adjacent the silicon seeding sites and the first amorphous silicon material which will further enhance the finished texturized surface (after the annealing is performed). It is preferred that the second amorphous silicon material be formed in the same manner as described for the formation of the initial amorphous silicon material.

The formed amorphous silicon material may be patterned (although it doesn't need to be patterned) into a desired shape by methods know in the art, or methods yet to be discovered As an example for the general embodiment depicted in FIG. 1, one of the many uses of the present invention is depicted in the construction of a DRAM container storage cell developed in FIGS. 2–5.

Referring now to FIG. 1, a bottom capacitor plate 23 is formed over a starting substrate 20 and makes contact to diffusion region 24. Diffusion region 24 spans between conductive lines 21 which are isolated from each other as well as from capacitor plate 23. In a DRAM application, lines 21 would typically represent word lines which provide access gates to capacitors, such as capacitor plate 23. Capacitor plate 23 is conductive and at least a portion of it is coated with amorphous silicon (or the plate could be amorphous silicon only).

Amorphous silicon coated plate 23 is then exposed to fluorine atoms for a preferred time ranging from 30 sec to 30 min to provide enough time for the amorphous silicon material to absorb a sufficient amount of fluorine atoms.

Figure 3:
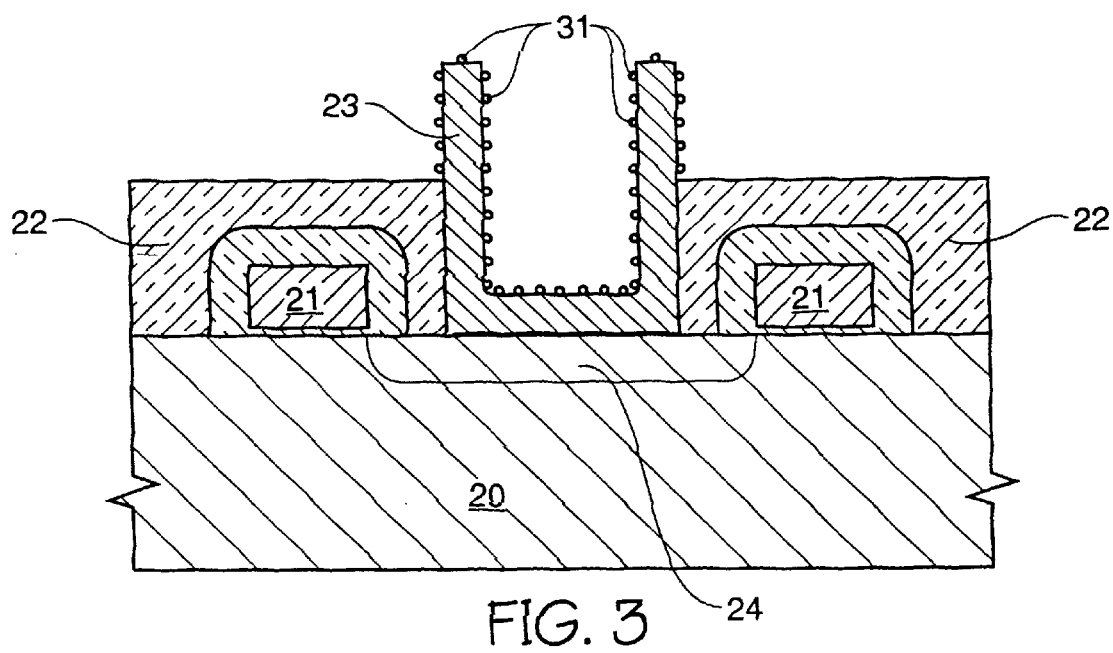
FIG. 3 is a composite cross-sectional view of the in-process wafer portion of FIG. 2 after the formation of silicon seeding sites.

As shown in FIG. 3, nucleation begins at the silicon surface as the gas is absorbed by the amorphous silicon and removes any native oxide (or oxide residue) to form silicon seeding sites 31 distributed on the surface of amorphous silicon layer 23.

Figure 4:
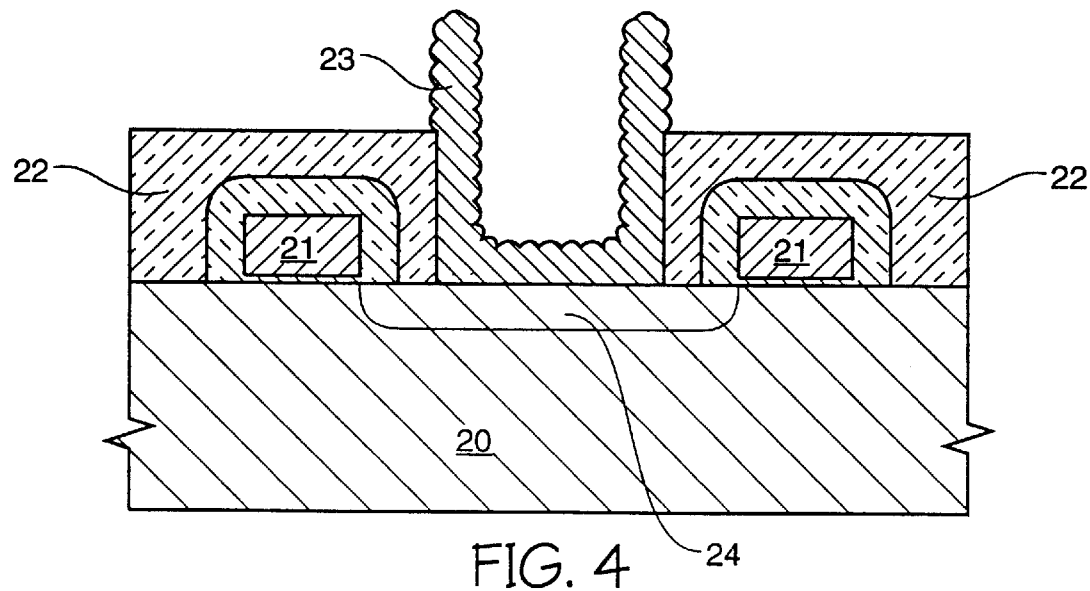
FIG. 4 is a cross-sectional view of the in-process wafer portion of FIG. 3, after the capacitor structure is subjected to annealing.
Figure 5:
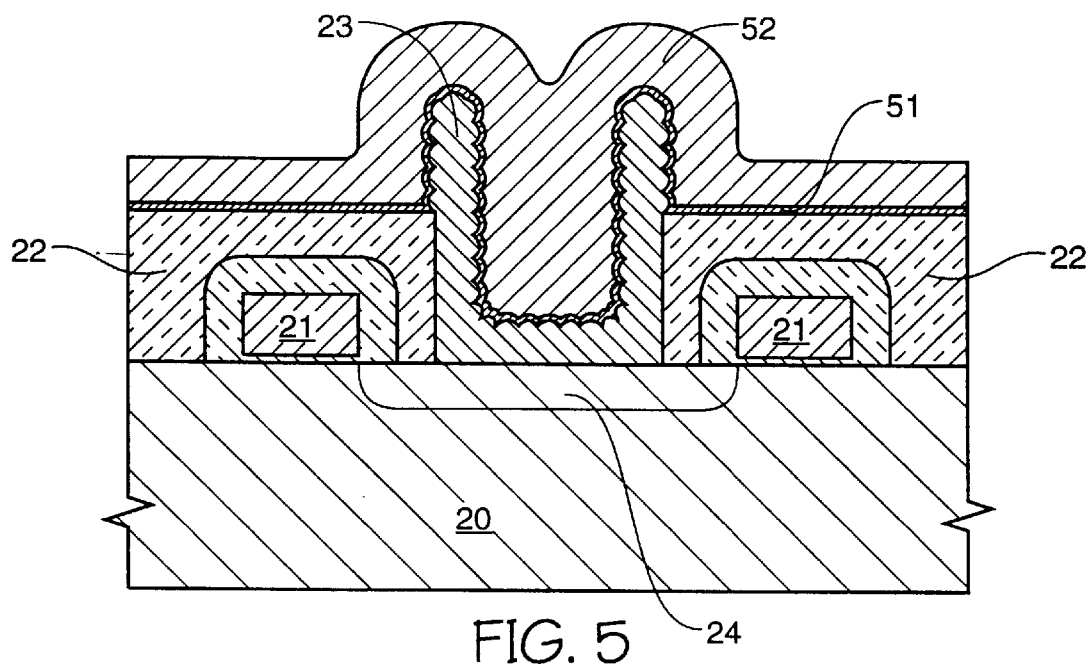
FIG. 5 is a cross-sectional view of the in-process wafer portion of FIG. 4 depicting a completed DRAM container storage cell.

As shown in FIG. 4 capacitor plate 23 is subjected to vacuum annealing after the amorphous silicon is subjected to fluorine atoms and after the formation of silicon seeding sites 31. The vacuum annealing transforms the amorphous silicon, having silicon seeding sites 31 distributed thereon, to a texturized polysilicon surface to make up a texturized capacitor plate.

It is preferred that the vacuum annealing be performed in a vacuum chamber at a pressure less than 0.1 Torr. It is also preferred that the vacuum chamber is operated at a temperature ranging from approximately 450° C. to 650° C. and that the annealing is carried out for a time period ranging from approximately 30 sec to 30 min. Vacuum annealing is then performed after the amorphous silicon material is exposed to the fluorine atoms and after a sufficient amount of fluorine atoms are absorbed into the amorphous material.

The texturized polysilicon surface may be further enhanced by depositing a second amorphous silicon layer adjacent the silicon seeding sites 31 and the first amorphous silicon layer prior to the vacuum annealing step. The capacitor plate may be conductively doped as desired either prior to, during or after the process steps, as depicted in FIG. 1, are performed Referring now to FIG. 5, the DRAM storage cell is completed by forming cell dielectric layer 51 over structure 23, followed by the formation of a second cell plate 52 (typically a conductively doped polysilicon or metal based layer). From this point on, the wafer is completed using conventional fabrication process steps.

It is to be understood that although the present invention has been described with reference to a preferred embodiment, various modifications, known to those skilled in the art, may be made to the structures and process steps presented herein without departing from the invention as recited in the several claims appended hereto.

What is claimed is:

1. A method for forming a texturized polysilicon surfaced capacitor plate structure for a semiconductor device, said method comprising the steps of:
   a) exposing a capacitor plate which is at least partially coated with an amorphous silicon material to fluorine atoms;
   b) forming silicon seeding sites distributed on the surface of said amorphous silicon material; and
   c) vacuum annealing said amorphous silicon material to form a texturized polysilicon on the surface of said capacitor plate, said step of vacuum annealing is performed after said amorphous silicon material is exposed to said fluorine atoms.

2. The method of claim 1, wherein said step of exposing of said capacitor plate is performed in a chamber under vacuum in the presence of a mixture of $CF_4$ and Ar.

3. The method of claim 1, wherein said step of exposing of said capacitor plate is performed in a chamber under vacuum in the presence of a fluorine containing gas.

4. The method of claim 3, wherein said fluorine containing gas is a gas selected from the group consisting of $CHF_3$ or $NF_4$.

5. The method of claim 1, wherein said amorphous silicon material is formed by depositing a amorphous silicon layer over a capacitor plate by plasma dissociation of a silicon containing gas.

6. The method of claim 5, wherein said silicon gas is a gas selected from the group consisting of $SiH_4$ or $Si_2H_6$.

7. The method of claim 5, wherein said method further comprises depositing a second amorphous silicon layer over said silicon seeding sites.

8. The method of claim 1, wherein said step of exposing said plate to fluorine atoms is performed for a period of time ranging from 30 sec to 30 min.

9. The method of claim 1, wherein said step of vacuum annealing is performed in a vacuum chamber at a pressure less than 0.1 Torr.

10. The method of claim 1, wherein said step of vacuum annealing is performed in a vacuum chamber at a temperature ranging from approximately 450° C. to 650° C.

11. The method of claim 1, wherein said step of vacuum annealing is performed in a vacuum chamber for a time period ranging from approximately 30 sec to 30 min.

12. A method for forming a texturized polysilicon surface, said method comprising the steps of:
   a) exposing an amorphous silicon material to fluorine atoms;
   b) forming silicon seeding sites distributed on the surface of said amorphous silicon material; and
   c) vacuum annealing said amorphous silicon material to form said texturized polysilicon surface, said step of vacuum annealing is performed after said amorphous silicon material is exposed to said fluorine atoms.

13. The method of claim 12, wherein said step of exposing is performed in a chamber under vacuum in the presence of a mixture of $CF_4$ and Ar.

14. The method of claim 12, wherein said step of exposing of said capacitor plate is performed in a chamber under vacuum in the presence of a fluorine containing gas.

15. The method of claim 14, wherein said fluorine containing gas is a gas selected from the group consisting of $CHF_3$ or $NF_4$.

16. The method of claim 12, wherein said amorphous silicon material is formed by depositing a amorphous silicon layer over a capacitor plate by plasma dissociation of a silicon containing gas.

17. The method of claim 16, wherein said silicon gas is a gas selected from the group consisting of $SiH_4$ or $Si_2H_6$.

18. The method of claim 16, wherein said method further comprises depositing a second amorphous silicon layer over said silicon seeding sites.

19. The method of claim 12, wherein said step of exposing is performed for a period of time ranging from 30 sec to 30 min.

20. The method of claim 12, wherein said step of vacuum annealing is performed in a vacuum chamber at a pressure less than 0.1 Torr.

21. The method of claim 12, wherein said step of vacuum annealing is performed in a vacuum chamber at a temperature ranging from approximately 450° C. to 650° C.

22. The method of claim 12, wherein said step of vacuum annealing is performed in a vacuum chamber for a time period ranging from approximately 30 sec to 30 min.

23. A method for forming a texturized polysilicon surfaced capacitor plate structure, said method comprising the steps of:

a) depositing an amorphous silicon layer over a capacitor plate by plasma dissociation of $SiH_4$;

b) exposing said amorphous silicon layer to fluorine atoms;

c) forming amorphous silicon seeding sites that are distributed on the surface of said first amorphous silicon layer by exposing said first amorphous layer to fluorine atoms; and d) vacuum annealing said amorphous silicon layer to form a texturized polysilicon on said capacitor plate, said step of vacuum annealing is performed after said amorphous silicon material is exposed to said fluorine atoms.

24. The method of claim 23, wherein said step of exposing is performed in a chamber under vacuum in the presence of a mixture of $CF_4$ and Ar.

25. The method of claim 23, wherein said step of exposing is performed for a period of time ranging from 30 sec to 30 min.

26. The method of claim 23, wherein said step of vacuum annealing is performed in a vacuum chamber at a pressure less than 0.1 Torr.

27. The method of claim 23, wherein said step of vacuum annealing is performed in a vacuum chamber at a temperature ranging from approximately 450° C. to 650° C.

28. The method of claim 23, wherein said step of vacuum annealing is performed in a vacuum chamber for a time period ranging from approximately 30 sec to 30 min.

29. The method of claim 23, wherein steps "b" and "c" are performed in situ.

* * * * *